United States Patent
Ozawa

(10) Patent No.: US 8,497,184 B2
(45) Date of Patent: Jul. 30, 2013

(54) METHOD FOR MANUFACTURING SEMICONDUCTOR DEVICE

(75) Inventor: Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 12/850,730

(22) Filed: Aug. 5, 2010

(65) Prior Publication Data

US 2011/0053339 A1 Mar. 3, 2011

(30) Foreign Application Priority Data

Aug. 25, 2009 (JP) ................. 2009-194135

(51) Int. Cl.
*H01L 21/76* (2006.01)

(52) U.S. Cl.
USPC .............. 438/424; 257/E21.546; 257/314

(58) Field of Classification Search
USPC ..... 438/424; 257/E21.546, E21.19, 314–326, 257/E27.078, E29.003–E29.309
See application file for complete search history.

(56) References Cited

U.S. PATENT DOCUMENTS

| 7,414,285 | B2 | 8/2008 | Akahori et al. |
| 2006/0060913 | A1 | 3/2006 | Ozawa |
| 2006/0202259 | A1 | 9/2006 | Ozawa |
| 2006/0240619 | A1 * | 10/2006 | Ozawa et al. ................. 438/257 |
| 2008/0121972 | A1 * | 5/2008 | Shiozawa et al. ............. 257/316 |
| 2009/0246932 | A1 | 10/2009 | Kamioka et al. |
| 2010/0140684 | A1 | 6/2010 | Ozawa |

FOREIGN PATENT DOCUMENTS

| JP | 2006-93327 | 4/2006 |
| JP | 2008-10480 | 1/2008 |

* cited by examiner

*Primary Examiner* — Tony Tran
(74) *Attorney, Agent, or Firm* — Finnegan, Henderson, Farabow, Garrett & Dunner, L.L.P.

(57) ABSTRACT

In one embodiment, a method for manufacturing a semiconductor device includes forming a first conductor layer on a surface of a semiconductor layer via a tunnel insulating film. The method includes forming an isolation trench extending from a surface of the first conductor layer to the semiconductor layer to form a plurality of conductive plates on the tunnel insulating film. The method includes filling the isolation trench with an element insulation insulating film from bottom of the isolation trench to an intermediate portion of a side surface of each of the conductive plates. The method includes forming a silicon nitride film on an exposed surface of the each of the conductive plates not covered with the element insulation insulating film. In addition, the method includes filling an upper portion of the isolation trench by forming a second conductor layer above the conductive plates and the element insulation insulating film.

7 Claims, 8 Drawing Sheets

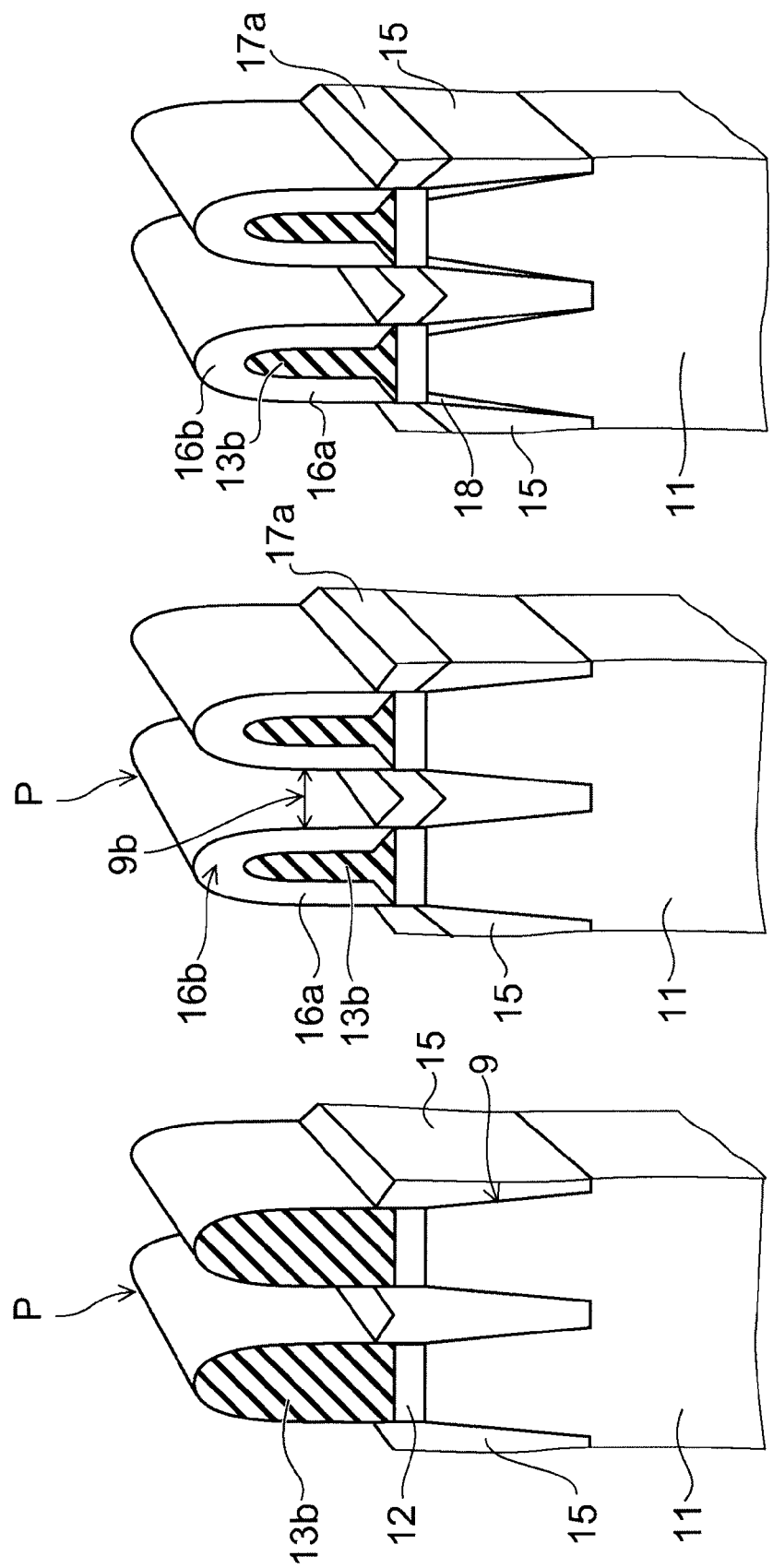

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-194135, filed on Aug. 25, 2009; the entire contents of which are incorporated herein by reference.

FIELD

Embodiments described herein relate generally to a method for manufacturing a semiconductor device.

BACKGROUND

Nonvolatile memory cells for performing write operation by storing charge in a floating gate electrode, hereinafter referred to as FG (floating gate) type memory cells, are widely used. On the other hand, there is constantly a strong demand for increasing the storage capacity of semiconductor memories.

In view of increasing the integration density of FG type memory cells, it is necessary to narrow the spacing between a plurality of floating gate electrodes provided via a tunnel insulating film on the surface of a semiconductor substrate. However, if the spacing between the floating gate electrodes is narrowed, then when a control gate electrode is formed on the floating gate electrode, filling failure may occur between the floating gate electrodes, or variation may occur in the gate resistance of the control gate electrode, causing the problem of malfunctions in memory cells.

On the other hand, the method of narrowing the floating gate electrode to ensure the electrode spacing is also effective in increasing the integration density of FG type memory cells. However, if the electrode width is narrowed, the aspect ratio of the cross-sectional shape of the floating gate electrode increases. This floating gate electrode easily falls down during processing or the subsequent cleaning step, and results in decreasing the manufacturing yield. For instance, in the case where the floating gate electrode has a height of approximately 60 nm, if the width of the floating gate electrode is 30 nm or less, the yield decrease due to collapse becomes non-negligible. Furthermore, if the width is 20 nm or less, forming the cell structure is in itself difficult. This places a technical limit to the floating gate electrode.

In view of avoiding the above problems, the method for forming the interelectrode insulating film provided between the floating gate electrode and the control gate electrode is important.

BRIEF DESCRIPTION OF THE DRAWINGS

FIGS. 1A to 4B are schematic views showing a method for manufacturing a memory cell according to a first embodiment;

FIGS. 6A to 6C are schematic views showing a method for manufacturing a memory cell according to a second embodiment; and FIGS. 7A to 9B are schematic views showing a method for manufacturing a memory cell according to a third embodiment.

DETAILED DESCRIPTION

Figure 1A:
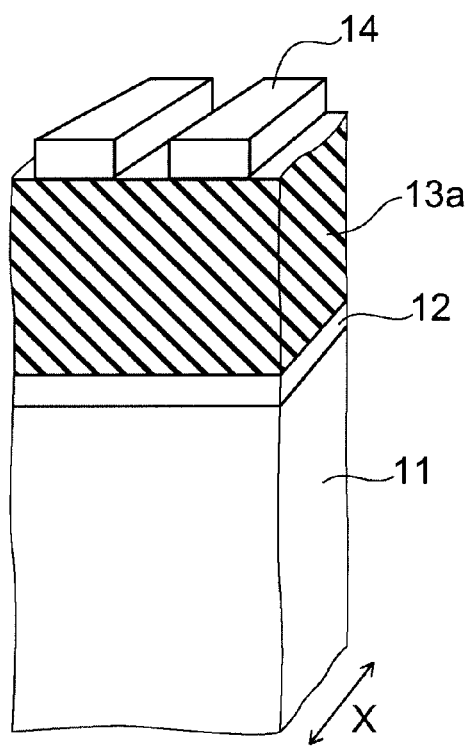

In general, according to one embodiment, a method for manufacturing a semiconductor device is disclosed. The method includes forming a first conductor layer containing silicon on a surface of a semiconductor layer via a tunnel insulating film. The method includes forming an isolation trench extending from a surface of the first conductor layer to the semiconductor layer to form a plurality of conductive plates serving as floating gate electrodes on the tunnel insulating film, the conductive plates being formed from the first conductor layer and spaced from each other by a prescribed width. The method includes filling the isolation trench with an element insulation insulating film from bottom of the isolation trench to an intermediate portion of a side surface of each of the conductive plates. The method includes forming a silicon nitride film on an exposed surface of the each of the conductive plates not covered with the element insulation insulating film while maintaining a spacing between the plurality of conductive plates at a width comparable to or larger than the prescribed width, the silicon nitride film being formed by nitridizing the silicon contained in the conductive plates by a nitrogen radical generated by exciting a raw material gas containing a nitrogen element. In addition, the method includes filling an upper portion of the isolation trench by forming a second conductor layer serving as a control gate electrode above the conductive plates with the silicon nitride film formed and above the element insulation insulating film buried in the isolation trench.

According to another embodiment, a method for manufacturing a semiconductor device is disclosed. The method includes forming a first conductor layer containing silicon on a surface of a semiconductor layer via a tunnel insulating film. The method includes forming an isolation trench extending from a surface of the first conductor layer to the semiconductor layer to form a plurality of conductive plates serving as floating gate electrodes on the tunnel insulating film, the conductive plates being formed from the first conductor layer and spaced from each other by a prescribed width. The method includes filling the isolation trench with an element insulation insulating film from bottom of the isolation trench to an intermediate portion of a side surface of each of the conductive plates. The method includes forming a silicon nitride film on an exposed surface of the each of the conductive plates not covered with the element insulation insulating film, the silicon nitride film being formed by nitridizing the silicon contained in the conductive plates by a nitrogen radical generated by exciting a raw material gas containing a nitrogen element. The method includes adding oxygen to the silicon nitride film by exposing the silicon nitride film to a gas atmosphere containing an oxygen element. In addition, the method includes filling an upper portion of the isolation trench by forming a second conductor layer serving as a control gate electrode above the conductive plates with the silicon nitride film formed and above the element insulation insulating film buried in the isolation trench.

According to still another embodiment, a method for manufacturing a semiconductor device is disclosed. The method includes forming a first conductor layer containing silicon on a surface of a semiconductor layer via a tunnel insulating film. The method includes forming an isolation trench extending from a surface of the first conductor layer to the semiconductor layer to form a plurality of conductive plates serving as floating gate electrodes on the tunnel insulating film, the conductive plates being formed from the first conductor layer and spaced from each other by a prescribed width. The method includes filling the isolation trench with an element insulation insulating film from bottom of the isolation trench to an intermediate portion of a side surface of each of the conductive plates. The method includes forming an oxygen-containing silicon nitride film on an exposed surface of each of the conductive plates not covered with the element insulation insulating film, the silicon nitride film being formed by oxynitridizing the silicon contained in the conductive plates by a nitrogen radical and oxygen radical generated by exciting a raw material gas containing a nitrogen element and oxygen element. In addition, the method includes filling an upper portion of the isolation trench by forming a second conductor layer serving as a control gate electrode above the conductive plates with the silicon nitride film formed and above the element insulation insulating film buried in the isolation trench.

First Embodiment

FIGS. 1A to 4B schematically show a process for manufacturing FG type memory cells according to a first embodiment. Each figure is a perspective view showing a cross section of two adjacent memory cells in the memory cell array section of a NAND flash memory, for instance. The cross sections are cut along the channel length direction (bit line direction) indicated by arrow X in FIG. 1A, and along the channel width direction (word line direction) orthogonal to the channel length direction.

First, as shown in FIG. 1A, a semiconductor layer doped with a desired dopant element is provided in the surface of a silicon substrate 11. A silicon oxide film 12 having a thickness of approximately 5-10 nm is formed at the surface of the silicon substrate 11 by thermal oxidation. The silicon oxide film 12 serves as a tunnel insulating film 12. Next, a polycrystalline silicon layer 13a having a thickness of approximately 50 nm is deposited by reduced-pressure CVD (chemical vapor deposition). The polycrystalline silicon layer 13a is a first conductor layer serving as a floating gate electrode 13. Here, in order to impart conductivity to the polycrystalline silicon layer 13a, the polycrystalline silicon layer 13a is doped with phosphorus as N-type impurity so as to have an impurity concentration of approximately $3 \times 10^{20}$ cm$^{-3}$, for instance.

Subsequently, a silicon oxide film is formed on the polycrystalline silicon layer 13a by reduced-pressure CVD. A resist mask processed into a prescribed shape is used to form a processing mask 14 from the silicon oxide film by various etching methods such as RIE (reactive ion etching). Here, the processing mask 14 is shaped like stripes extending in the channel length direction as shown in FIG. 1A. The lateral width of the processing mask 14 determines the channel width of the floating gate electrode 13. The spacing between the adjacent portions of the processing mask 14 corresponds to the spacing of a prescribed width between the floating gate electrodes 13. In this embodiment, for instance, the processing mask 14 is shaped like stripes extending in the channel length direction with a lateral width of 30 nm and a spacing of 20 nm. It is noted that the processing mask 14 can alternatively be made of a resist material, if adapted to the etching method.

Next, the processing mask 14 is used as a mask to successively etch the polycrystalline silicon layer 13a and the silicon oxide film 12 by RIE, and further etch the surface of the silicon substrate 11 to a depth of approximately 50 nm. Thus, isolation trenches 9 extending from the surface of the polycrystalline silicon layer 13a to the semiconductor layer are formed, so that the polycrystalline silicon layer 13a can be divided into a plurality of conductive plates, i.e., polycrystalline silicon plates 13b.

Figure 1B:
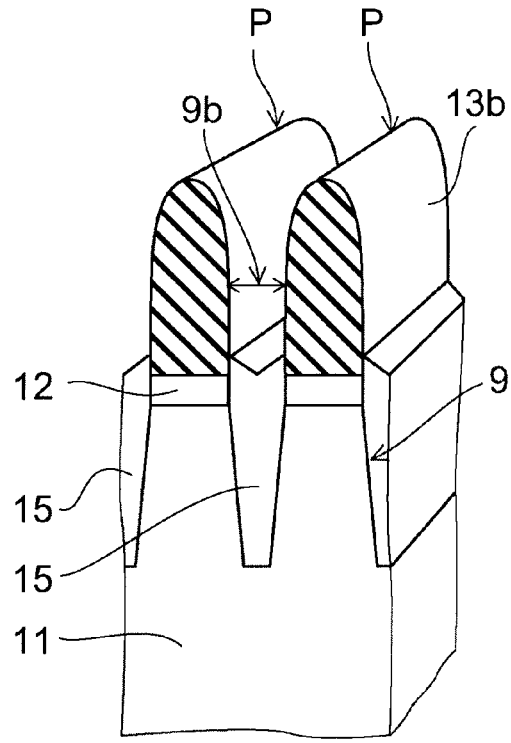

FIG. 1B is a schematic view showing a silicon oxide film 15, i.e., an element insulation insulating film, formed in the isolation trench 9.

As shown in FIG. 1B, for instance, isolation trenches 9 having an opening width of approximately 20 nm and an opening depth of approximately 100 nm are formed in conjunction with polycrystalline silicon plates 13b. The polycrystalline silicon plates 13b are a plurality of conductive plates serving as floating gate electrodes 13. The polycrystalline silicon plate 13b is formed with a width of approximately 30 nm and a height of approximately 50 nm, ensuring that the floating gate electrode 13a to be formed therefrom has a gate width of approximately 30 nm. Hence, this polycrystalline silicon plate 13b does not fall down after etching. Here, etching of the isolation trench 9 can be based on, for instance, an RIE process using a halogen etching gas added with a carbon-containing gas such as methane. In this etching process, the etching selection ratio of the processing mask 14 to the polycrystalline silicon layer 13a and the silicon substrate 11 can be decreased so that the processing mask 14 does not remain after etching. At this time, etching of the processing mask 14 gradually proceeds from its upper surface edge. Hence, as shown in FIG. 1B, the top portion P of the polycrystalline silicon plate 13b can be finished with a round shape.

Next, in order to fill the isolation trench 9 with silicon oxide film 15, a silicon oxide film having a thickness of approximately 150 nm is deposited by plasma CVD on the entire surface of the silicon substrate 11 with the polycrystalline silicon plates 13b formed thereon. Subsequently, the surface is planarized by CMP (chemical mechanical polish) treatment, thereby removing the superficial portion of the silicon oxide film 15 and the remaining processing mask 14. Furthermore, the silicon oxide film 15 exposed at the planarized surface is etched with a dilute hydrofluoric acid solution so that the silicon oxide film 15 is set back along the side surface of the polycrystalline silicon plate 13b to the midpoint of the side surface. Thus, for instance, as shown in FIG. 1B, the isolation trench 9 can be partly filled with the silicon oxide film 15 from the bottom of the isolation trench 9 to the position of covering the lower portion of the polycrystalline silicon plate 13b, while the top portion and most of the side surface of the polycrystalline silicon plate 13b can be exposed. Furthermore, an opening 9b having a width of approximately 20 nm is formed at the top of the isolation trench 9 between the adjacent polycrystalline silicon plates 13b.

At this time, it is often the case that the etching rate of the silicon oxide film 15 is different between around the center of the isolation trench 9 and near the polycrystalline silicon plate 13b. For instance, in the case where the etching rate around the center of the isolation trench 9 is faster than that near the surface of the polycrystalline silicon plate 13b, the silicon oxide film 15 is processed into a shape hollowed from the polycrystalline silicon plate 13b toward the center of the isolation trench 9 as shown in FIG. 1B.

Here, before filling the isolation trench 9 with the silicon oxide film 15, a thin silicon oxide film of 5 nm or less, known as a liner insulating film, can be formed on the inner surface of the isolation trench 9 by thermal oxidation or thermal CVD. This liner insulating film has a slower etching rate and a film quality of higher insulating performance than a silicon oxide film formed by plasma CVD, for instance. Thus, in etching the silicon oxide film 15, the controllability of the exposed surface area of the polycrystalline silicon plate 13b can be improved. Furthermore, the element isolation breakdown voltage between memory cells can be increased.

Figure 2A:
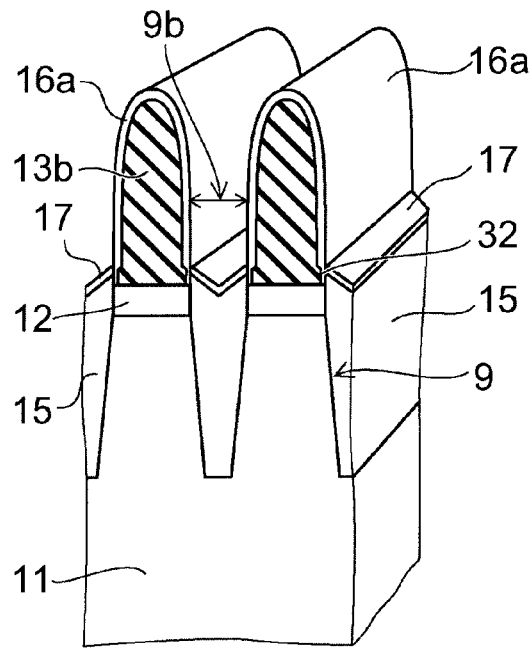
Figure 2B:
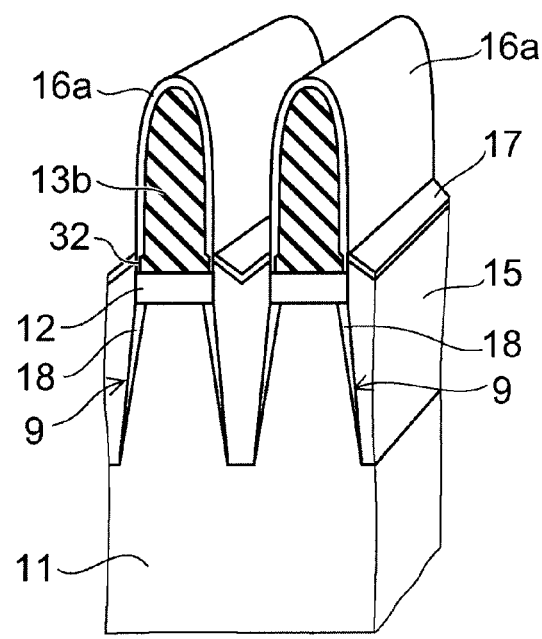

FIGS. 2A and 2B are schematic views showing the step for nitridizing the exposed surface of the polycrystalline silicon plate 13b to form a silicon nitride film 16a serving as an interelectrode insulating film 16.

The silicon substrate 11 with the polycrystalline silicon plates 13b formed thereon is heated under a reduced pressure of 2 kPa or less, for instance, and nitrogen radicals are supplied to the surface of the polycrystalline silicon plates 13b to perform radical nitridation treatment. Thus, a silicon nitride film 16a can be formed at the exposed surface of the polycrystalline silicon plate 13b not covered with the silicon oxide film 15. Nitrogen radicals can be generated by, for instance, exciting a raw material gas primarily composed of nitrogen gas into plasma by microwaves, RF waves, or electron cyclotron resonance.

FIG. 2A is a schematic view showing the silicon nitride film 16 formed at the surface of the polycrystalline silicon plates 13b by radical nitridation treatment.

The silicon nitride film 16a formed at the surface of the polycrystalline silicon plate 13b serves as an interelectrode insulating film 16 for insulating the floating gate electrode 13 from a control gate electrode 19 (see FIGS. 3A and 3B) provided on the floating gate electrode 13. Hence, the silicon nitride film 16a is formed with a film thickness such that it can function as an interelectrode insulating film 16. Thus, the treatment time of radical nitridation treatment is adjusted by the substrate temperature and the density of supplied nitrogen radicals so that a silicon nitride film with a desired film thickness can be obtained. For instance, in the case of performing radical nitridation treatment using a normal processing apparatus, preferably, the heating temperature of the silicon substrate 11 is set in the range of 300-800° C., and the treatment time is set in the range of 10-1000 seconds.

In the case where a silicon nitride film 16a having a thickness of approximately 5 nm, for instance, is formed at the surface of the polycrystalline silicon plate 13b, it is desirable that the silicon substrate 11 be heated to a temperature near 800° C., and the treatment time be set near 1000 seconds. Thus, silicon in the superficial portion of the polycrystalline silicon plate 13b can be nitridized and transformed into a silicon nitride film 16a having a thickness of approximately 5 nm. Furthermore, the superficial portion of the silicon oxide film 15 filling the isolation trench 9 is also similarly subjected to radical nitridation treatment and transformed into a silicon oxynitride film 17 having a thickness of approximately 5 nm. The concentration of nitrogen contained in the silicon oxynitride film 17 formed at the surface of the silicon oxide film 15 is higher at a position nearer to the surface, and the maximum concentration is approximately 10-50%.

Here, the film thickness of the silicon nitride film 16a formed by radical nitridation of silicon at the surface of the polycrystalline silicon plate 13b is nearly equal to the thickness of the surface layer of the polycrystalline silicon plate 13b transformed into the silicon nitride film 16a. That is, before and after the radical nitridation treatment, the width of the opening 9b between the adjacent polycrystalline silicon plates 13b can be equally maintained at the width of approximately 20 nm formed by etching.

On the other hand, because silicon in the superficial portion of the polycrystalline silicon plate 13b is transformed into the silicon nitride film 16a by radical nitridation treatment, the width of the polycrystalline silicon plate 13b remaining without being nitridized is narrowed from both sides by approximately 5 nm each, with a finish width of approximately nm. In other words, conventionally, a floating gate structure having a gate width of 20 nm cannot be formed because the polycrystalline silicon plate 13b collapses during processing. In contrast, such a floating gate structure can be realized by the manufacturing method according to this embodiment.

FIG. 2B is a schematic view showing the silicon nitride film 16a formed at the surface of the polycrystalline silicon plate 13b and subsequently subjected to thermal oxidation treatment in an atmosphere containing oxygen gas.

The thermal oxidation treatment can be performed, for instance, at a temperature of 800-1100° C. in a 1-10% dilute oxygen gas atmosphere. Here, the treatment can also be performed under a reduced pressure. The treatment time is adjusted by the temperature and oxygen gas partial pressure. Typically, it is desirable to perform the treatment for 1-100 seconds. Thus, the silicon nitride film 16a is densified, and added with 1 ppm to 1% oxygen. Furthermore, if the surface of the silicon substrate 11 is subjected to plasma damage in the radical nitridation treatment, the generated film defects (such as so-called dangling bonds) can be repaired. Consequently, the insulating performance of the silicon nitride film 16a is significantly improved. Thus, the silicon nitride film 16a acquires an insulating performance such that it can function well as an interelectrode insulating film 16.

Furthermore, a similar repairing effect is achieved also in the silicon oxynitride film 17 formed at the surface of the silicon oxide film 15 filling the isolation trench 9. This can significantly improve the insulating performance. Consequently, migration of charge between the adjacent floating gate electrodes 13 via the silicon oxynitride film 17 is suppressed, and the charge retention characteristics of memory cells can be improved.

Moreover, oxygen molecules contained in the atmosphere for the thermal oxidation treatment are transmitted through the silicon oxynitride film 17 and the silicon oxide film 15 to the surface of the bottom inner wall of the isolation trench 9 and oxidize the surface of the silicon substrate 11. The thickness of the silicon oxide film 18 formed accordingly can be, for instance, approximately 5 nm near the tunnel insulating film 12. This thickness is thinner at a position farther from the tunnel insulating film 12. Thus, the channel width of the lower interface of the tunnel insulating film 12 is narrowed from both sides by approximately 5 nm each, with a finish width of approximately 20 nm.

On the other hand, also in the lower portion of the polycrystalline silicon plate 13b covered with the silicon oxide film 15 and the silicon oxynitride film 17, oxygen molecules contained in the atmosphere for the thermal oxidation treatment reach the surface of the polycrystalline silicon plate 13b. However, in this region, a thin silicon nitride film 32 has been formed. This silicon nitride film 32 has been formed by nitrogen radicals transmitted through the silicon oxide film 15 to the surface of the polycrystalline silicon plate 13b during the radical nitridation treatment. This prevents the progress of oxidation reaction even if oxygen molecules reach the surface of the floating gate electrode 13, and the formation of silicon oxide film is suppressed. That is, the width of the floating gate electrode 13 is substantially maintained at the upper interface of the tunnel insulating film 12, but narrowed at the lower interface thereof. Consequently, the cell coupling ratio of the floating gate electrode 13 is increased, and the operating voltage can be reduced.

Figure 3A:
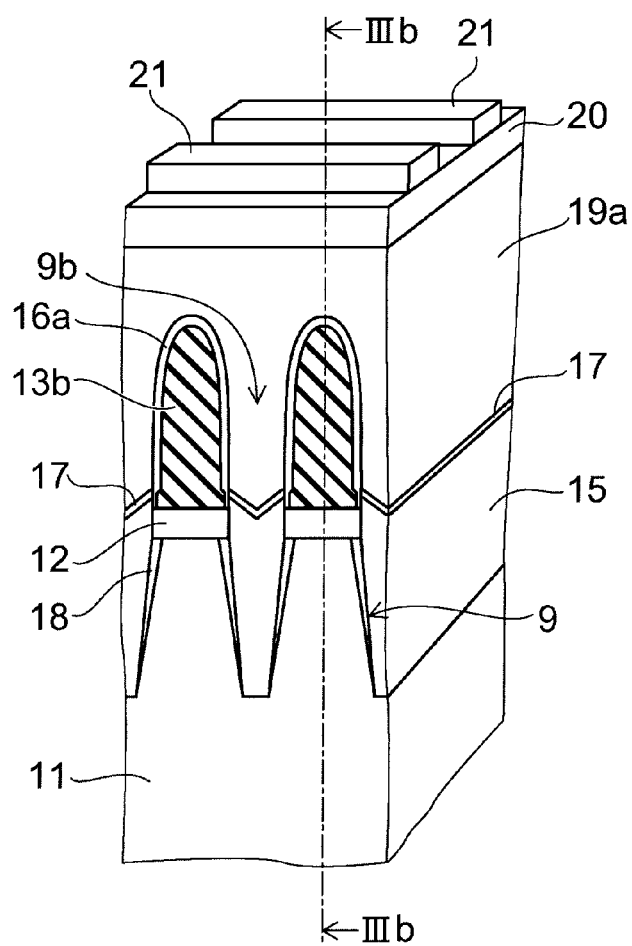
Figure 3B:
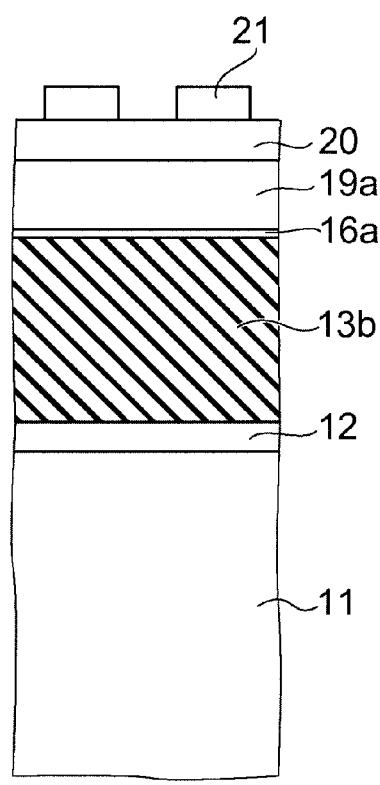

FIG. 3A is a schematic view showing a polycrystalline silicon layer 19a formed above the polycrystalline silicon plates 13b with the silicon nitride film 16a formed thereon, and above the silicon oxide film 15 filling the isolation trench 9. The polycrystalline silicon layer 19a is a second conductor layer serving as a control gate electrode 19, and has a thickness of approximately 50 nm. The polycrystalline silicon layer 19a fills the opening 9b at the top of the isolation trench 9 between the adjacent polycrystalline silicon plates 13b. FIG. 3B is a schematic view showing the IIIb-IIIb cross section indicated in FIG. 3A.

The polycrystalline silicon layer 19a is a conductor layer doped with phosphorus as N-type impurity, and can be deposited by reduced-pressure CVD, for instance. At this time, the opening 9b between the adjacent polycrystalline silicon plates 13b can also be filled with the polycrystalline silicon layer 19a. No filling failure occurs because the opening 9b between the polycrystalline silicon plates 13b is maintained at the width of approximately 20 nm formed by etching. Furthermore, the doping gas containing phosphorus as N-type impurity is sufficiently supplied also into the opening 9b. Hence, the polycrystalline silicon layer 19a buried in the opening 9b also has low resistance, and can function as a control gate electrode 19. Thus, when the control gate electrode 19 is applied with a desired voltage, the entire region of the control gate electrode 19 is placed at a desired potential nearly uniformly. Hence, malfunctions in memory cells can be avoided.

Next, a processing mask for dividing the polycrystalline silicon layer 19a into control gate electrodes 19 is formed. As shown in FIG. 3A, a silicon nitride film 20 serving as a processing mask is formed on the polycrystalline silicon layer 19a by reduced-pressure CVD. Furthermore, a resist mask 21 for patterning the silicon nitride film 20 is formed. Here, for instance, the resist mask 21 is shaped like stripes extending in the channel width direction and having a width of approximately 25 nm. The spacing between the adjacent portions of the pattern can be approximately 25 nm.

Figures 4A, 4B:
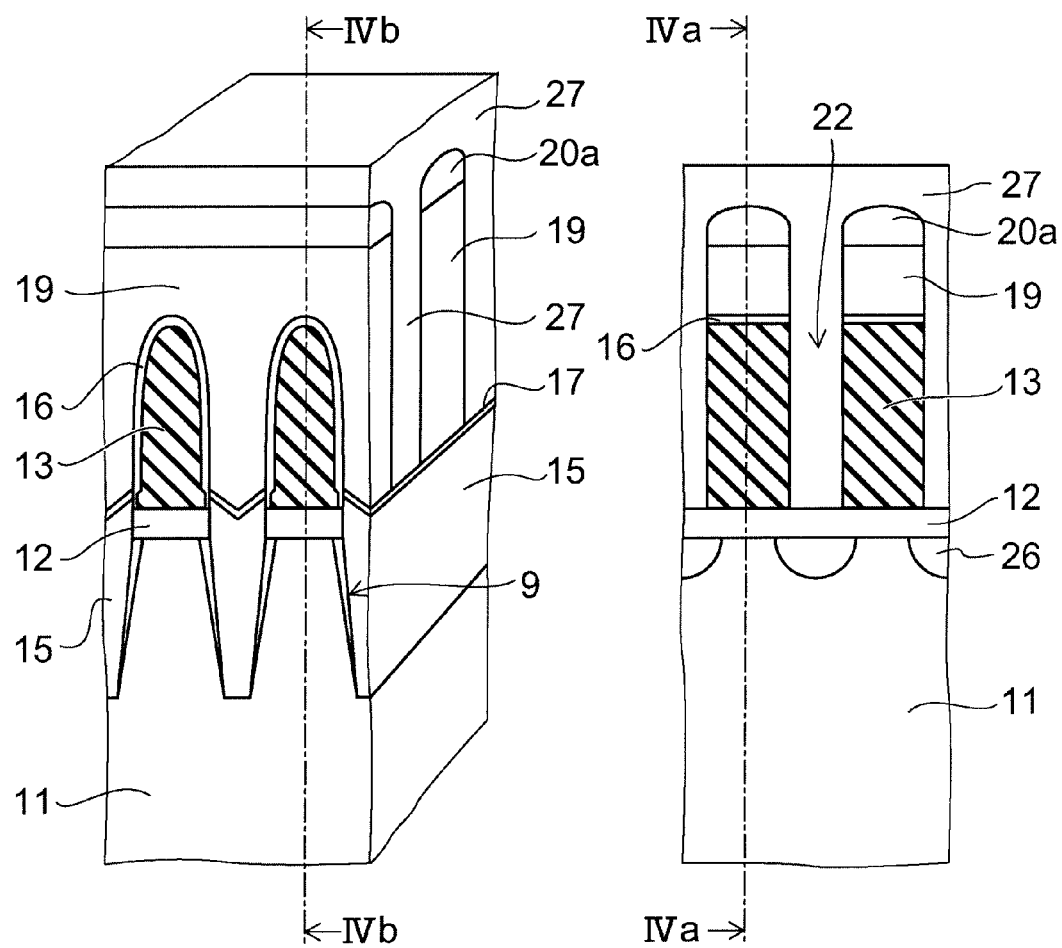

Next, the resist mask 21 is used as an etching mask to pattern the silicon nitride film 20 by RIE. Thus, the silicon nitride film 20 is patterned in a striped configuration to form a processing mask 20a. Furthermore, as shown in FIGS. 4A and 4B, the processing mask 20a is used as an etching mask to successively etch the polycrystalline silicon layer 19a, the silicon nitride film 16a, and the polycrystalline silicon plates 13b, thereby forming a control gate electrode 19, an interelectrode insulating film 16, and a floating gate electrode 13. Thus, a slit portion 22 and a cell stack structure are formed. For instance, the slit portion 22 has an opening of approximately 25 nm and an opening depth of approximately 150 nm, and the cell stack structure has a width of approximately 25 nm and a height of 150 nm. Here, the cell stack structure has a stacked structure of the processing mask 20a, the control gate electrode 19, the interelectrode insulating film 16, and the floating gate electrode 13.

Next, the cell stack structure is used as a mask to ion-implant N-type impurity such as arsenic into the superficial portion of the silicon substrate 11 via the tunnel insulating film 12 exposed at the bottom of the slit portion 22. Furthermore, the implanted impurity is activated by heat treatment to form a diffusion layer 26.

Next, in order to fill the slit portion 22 with an insulator, an interlayer insulating film 27 made of silicon oxide film is formed by CVD, for instance. Subsequently, wiring layers are formed by normal manufacturing methods. Thus, the memory cell structure can be completed.

Figures 5A, 5B:
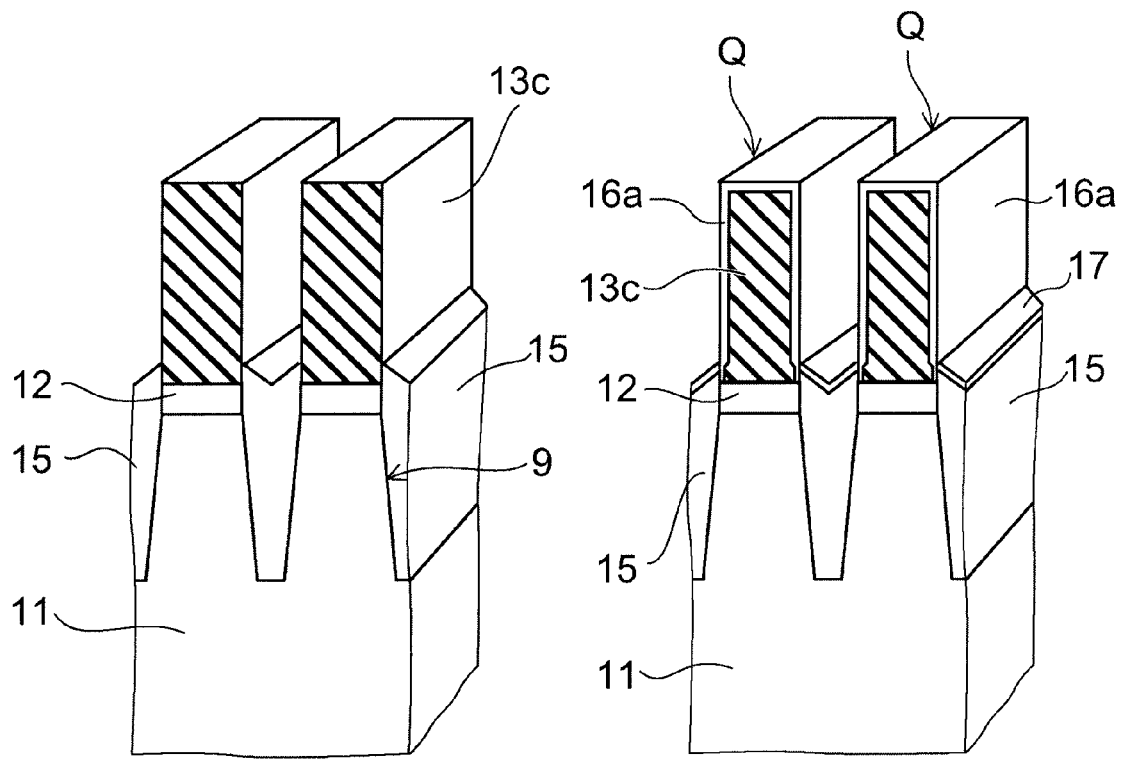
FIGS. 5A and 5B are schematic views showing a variation of the method for manufacturing a memory cell according to the first embodiment.

In the above example of this embodiment, as shown in FIG. 1B, when the isolation trench 9 is processed by RIE, the upper portion of the polycrystalline silicon plate 13b is processed into a round shape. However, as shown in FIG. 5A, the upper portion of the polycrystalline silicon plate 13b can also be finished with a rectangular shape. In this case, the isolation trench 9 is etched under the condition that the processing mask 14 is not etched, or has a slow etching rate. The processing mask 14 is removed after completing the etching of the isolation trench 9. For instance, when the silicon oxide film 15 grown to fill the isolation trench 9 is planarized and removed by CMP, the processing mask 14 can also be removed.

The polycrystalline silicon plate 13c with the upper portion processed into a rectangular shape is subjected to radical nitridation treatment. Thus, as shown in FIG. 5B, a silicon nitride film 16a is formed at the exposed surface. In this case, the polycrystalline silicon plate can be left in a large volume after the radical nitridation treatment. Hence, as compared with the case of processing the upper portion into a round shape, depletion of the floating gate electrode 13 is less likely to occur. Thus, advantageously, the decrease of cell coupling ratio can be prevented. However, electric field concentration is likely to occur at the upper surface edge Q of the polycrystalline silicon plate 13c, and the leakage current flowing between the control gate electrode 19 and the floating gate electrode 13 may increase. In this case, it is desirable to use an interelectrode insulating film 16 having high insulation breakdown voltage.

As described above, in the process for manufacturing FG type memory cells according to this embodiment, the superficial portion of a plurality of polycrystalline silicon plates 13b, each serving as a floating gate electrode 13, is transformed by radical nitridation treatment into a silicon nitride film 16a serving as an interelectrode insulating film 16. At this time, the width of the upper opening 9b of the isolation trench 9 between the adjacent polycrystalline silicon plates 13b formed by etching is retained. Thus, when the plurality of polycrystalline silicon plates 13b are buried with a polycrystalline silicon layer 19a, filling failure and the resistance increase of the polycrystalline silicon layer 19a can be avoided.

For instance, in the method for manufacturing a semiconductor device described in JP-A 2008-10480 (Kokai), a NONON stacked film serving as an interelectrode insulating film is deposited on the surface of the polycrystalline silicon plate. This narrows the opening width between the polycrystalline silicon plates formed by etching. For instance, if a deposition film having a film thickness of 5-10 nm is formed, the opening width is narrowed by as large as 10-20 nm. Furthermore, in the semiconductor device described in JP-A 2006-93327 (Kokai), the surface of the polycrystalline silicon plate is oxidized to form a silicon oxide film. At this time, the film thickness of the silicon oxide film is typically twice or more as thick as the thickness of the surface layer to be oxidized. This narrows the opening width between the polycrystalline silicon plates formed by etching. For instance, if a silicon oxide film having a film thickness of 5-10 nm is formed, the opening width is narrowed by as large as 5-10 nm or more. Thus, in the case where the opening width between the floating gate electrodes after etching is reduced to the same width of approximately 20 nm as in this embodiment, filling failure and the resistance increase of the control gate electrode are unavoidable, and may cause malfunctions in memory cells. Clearly, these problems can be solved by the method for manufacturing FG type memory cells according to this embodiment, in which the spacing between the floating gate electrodes is maintained so as to avoid filling failure and the resistance increase of the control gate electrode. Thus, the integration density of memory cells can be increased.

Furthermore, according to this embodiment, the silicon nitride film 16a formed by radical nitridation treatment is thickened. This makes it possible to narrow the finish width of the floating gate electrode 13 while avoiding collapse of the polycrystalline silicon plate 13b serving as the floating gate electrode 13. For instance, by increasing the thickness of the silicon nitride film 16a to approximately 10 nm, the floating gate electrode 13 can be narrowed to approximately 5 nm, which is the limit to enable the floating gate electrode 13 to function as an electrode by avoiding depletion of the floating gate electrode 13.

Furthermore, in this embodiment, by performing nitridation treatment in a nitrogen radical atmosphere, the treatment temperature can be decreased. This can avoid degradation of the tunnel insulating film 12 due to thermal damage in forming the silicon nitride film 16a at the surface of the polycrystalline silicon plate 13b. That is, the reliability of memory cells can be improved by effectively avoiding degradations in the tunnel insulating film, such as increased leakage current, increased charge trap density, and degradation of insulation withstand capability.

For instance, instead of radical nitridation treatment, it is also possible to use thermal nitridation treatment with ammonia gas or nitrogen fluoride gas. However, in the case of forming a thick silicon nitride film 16a, it is necessary to perform thermal nitridation treatment at a high temperature of 1000° C. or more for a long time of one hour or more, for instance. Hence, film quality degradation of the tunnel insulating film 12 due to thermal damage is noticeable, decreasing the reliability of memory cells. From this viewpoint, radical nitridation treatment is desirable.

Moreover, in this embodiment, oxidation treatment is additionally performed after the nitridation treatment to add oxygen to the silicon nitride film 16a serving as an interelectrode insulating film 16. This dramatically improves the insulating performance of the interelectrode insulating film 16. Thus, the memory cell can achieve fast operation and high reliability. In particular, as compared with silicon nitride film and silicon oxide film formed by other processes such as CVD and ALD (atomic layer deposition), the leakage current and charge trap density are significantly reduced, and the insulation withstand capability is significantly improved.

In this embodiment, the material of the floating gate electrode 13 is made of polycrystalline silicon doped with phosphorus. However, the material is not limited thereto. The material may be doped with a different impurity element, or may be amorphous silicon or single crystal silicon. Furthermore, the material may contain other elements such as germanium. Moreover, the material may be any silicon-containing conductor material, and can be metal silicide such as tungsten silicide.

Furthermore, in the above description of this embodiment, the film thickness of the silicon nitride film 16a formed at the surface of the polycrystalline silicon plates 13b is nearly equal to the thickness of the surface layer of the polycrystalline silicon plate 13b transformed into the silicon nitride film 16a. Hence, the opening width between the adjacent polycrystalline silicon plates 13b is substantially maintained before and after forming the silicon nitride film 16a. However, this embodiment is not limited thereto. The silicon nitride film can be densified by increasing the treatment temperature of radical nitridation or thermal nitridation, or by additional high-temperature annealing at 1000° C. or more after forming the silicon nitride film 16a. Then, the film thickness of the silicon nitride film 16a can be typically made smaller by approximately 10% than the thickness of the surface layer of the polycrystalline silicon plate 13b transformed into the silicon nitride film 16a. This widens the width of the opening 9b at the top of the isolation trench 9 by approximately 20%. Hence, the integration density of memory cells can be further increased while avoiding malfunctions in the memory cells.

Conversely, depending on the setting of the nitridation treatment condition, the film thickness of the silicon nitride film 16a may be larger than the thickness of the surface layer of the polycrystalline silicon plate 13b transformed into the silicon nitride film 16a. For instance, the film thickness of the silicon nitride film 16a increases if the treatment temperature of radical nitridation or thermal nitridation is too low to sufficiently densify the silicon nitride film, or if the concentration of residual impurities such as hydrogen and fluorine in the silicon nitride film is high. However, as long as the silicon nitride film is formed by radical nitridation or thermal nitridation, the typical increase of film thickness is limited to approximately 10%. Hence, the frequency of memory cell malfunctions can be sufficiently reduced as compared with conventional techniques.

The nitrogen radical supplied in the radical nitridation treatment of this embodiment refers generally to a nitrogen atom in a chemically excited state or ground state, or a nitrogen molecule in a chemically excited state. The nitrogen radical may be either electrically neutral or charged. In this invention, the "nitrogen radical" is defined as any radical species containing nitrogen as a constituent element, including radical species containing other elements such as hydrogen and fluorine. Hence, the raw material gas for generating nitrogen radicals is not limited to nitrogen gas. A gas containing the nitrogen element, such as ammonia gas and nitrogen fluoride gas, can be used. However, in view of forming a dense silicon nitride film allowing a wide opening width, nitrogen gas is desirable as a raw material gas. Furthermore, it is often the case that the silicon nitride film 16a formed by radical nitridation treatment typically has a thickness of 2-10 nm. However, it is desirable to thicken the silicon nitride film 16a to improve the insulating performance in serving as an interelectrode insulating film 16. Thus, it is desirable to increase the density of nitrogen radicals as high as possible. To this end, for instance, it is useful to increase the substrate temperature as high as possible within the temperature range of 800° C. or less for avoiding the degradation of the tunnel insulating film 12. In addition, it is useful to decrease the treatment pressure to 1 kPa or less, and to increase the power of microwaves or RF waves.

Furthermore, in the above description of this embodiment, thermal oxidation treatment is performed in an oxygen gas atmosphere. If thermal oxidation is performed in an oxygen gas atmosphere, the superficial portion of the silicon nitride film 16a is less likely to be transformed into a silicon oxide film. Hence, the proportion of oxygen added to the silicon nitride film 16a can be reduced. Thus, increase in the film thickness of the silicon nitride film 16a can be suppressed, and the narrowing of the opening 9b at the top of the isolation trench 9 between the polycrystalline silicon plates 13b can be neglected. That is, the treatment in an oxygen gas atmosphere is desirable from the viewpoint of increasing the integration density of memory cells by ensuring the spacing between the polycrystalline silicon plates 13b for forming the control gate electrode 19.

On the other hand, it is also possible to perform the treatment in a different gas atmosphere containing the oxygen element, such as a water vapor atmosphere and an oxygen radical atmosphere. If thermal oxidation treatment is performed in a water vapor atmosphere or an oxygen radical atmosphere, nitrogen is eliminated from the superficial portion of the silicon oxynitride film 17 formed in the isolation trench 9, and the nitrogen concentration near the surface is reduced to ½ or less. This decreases the dielectric constant of the silicon oxynitride film 17, and the parasitic capacitance between the silicon substrate 11 and the control gate electrode 19 can be reduced. Hence, a water vapor atmosphere and an oxygen radical atmosphere are desirable from the viewpoint of increasing the operating speed of memory cells. (In this invention, the "oxygen radical" is defined as any radical species containing oxygen as a constituent element, including radical species containing other elements such as hydrogen.) Here, in any oxidizing atmosphere including an oxygen gas atmosphere, higher temperature and longer time are more favorable to repairing film defects in the silicon nitride film. However, under the condition of higher temperature and longer time, oxidation proceeds from the superficial portion of the silicon nitride film 16a, and the increase of film thickness associated with the increase of oxygen content becomes non-negligible. Reducing the partial pressure of oxidizing components by dilution and/or pressure reduction is effective in suppressing the increase of film thickness of the silicon nitride film 16a.

It is noted that the radical nitridation treatment of this embodiment may be performed in an atmosphere containing nitrogen radicals and oxygen radicals. For instance, a raw material gas containing the nitrogen element and the oxygen element, such as a mixed gas of oxygen and nitrogen, nitrogen monoxide gas, or nitrous oxide gas, can be excited into plasma by microwaves, RF waves, or electron cyclotron resonance. Thus, nitrogen radicals and oxygen radicals can be simultaneously generated and supplied onto the surface of the silicon substrate 11. Alternatively, nitrogen monoxide radicals or nitrous oxide radicals containing oxygen and nitrogen as constituent elements can be generated and supplied to the surface of the silicon substrate 11. By these methods, a silicon nitride film added with oxygen (silicon oxynitride film) can be formed even if the subsequent thermal oxidation treatment is omitted. That is, it is possible to simultaneously achieve the effect of maintaining the film quality of the tunnel insulating film 12 by avoiding thermal damage, and the effect of improving the insulating performance of the interelectrode insulating film 16 by addition of oxygen. Furthermore, the oxygen concentration in the silicon nitride film can be controlled by adjusting the mixing ratio of the raw material gas.

Instead of the radical nitridation treatment of this embodiment, for instance, it is also possible to form a thick silicon oxide film by thermal oxidation treatment, and its superficial portion can be dry etched or wet etched to form an interelectrode insulating film made of silicon oxide film having a desired thickness, while ensuring the width of the opening 9b between the adjacent polycrystalline silicon plates 13b. However, in this method, the etching amount is difficult to control, and the characteristics variation of memory cells is considered unavoidable. Hence, the radical nitridation treatment of this embodiment is desirable from the viewpoint of reducing the characteristics variation of memory cells.

Here, the structure of the interelectrode insulating film 16 formed in this embodiment is described. For instance, in a radical nitridation treatment such as exposing the silicon substrate 11 to a plasma, the position in the interelectrode insulating film 16 nearer to its surface side is subjected to more plasma damage, and has high density of film defects acting as charge trap states. During oxidation treatment after the radical nitridation treatment, repair of film defects by addition of oxygen proceeds from the surface side. Consequently, in the interelectrode insulating film 16, the film defect density is maximized in the intermediate region in the film thickness direction, and decreased toward both interfaces on the control gate electrode 19 side and on the floating gate electrode 13 side. That is, charge trap states due to film defects are distributed primarily in the center portion of the interelectrode insulating film 16. Thus, in memory write/erase operation, the leakage current flowing via charge trap states can be reduced, enabling fast operation of memory cells. Furthermore, the interelectrode insulating film 16 has a composition of silicon nitride film with the oxygen content being lower at a position nearer to the floating gate electrode 13. That is, the dielectric constant of the interelectrode insulating film 16 is higher at a position nearer to the floating gate electrode 13. This decreases the tunneling probability of charge from the floating gate electrode 13 side. Thus, even in the top portion P of the floating gate electrode 13 subjected to high electric field due to its curvature, the leakage current can be effectively suppressed. Hence, the phenomenon of increased leakage current in memory write operation can be effectively suppressed.

In this embodiment, as shown in FIGS. 2A and 2B, the radical nitridation treatment is performed on the polycrystalline silicon plate 13b serving as a floating gate electrode 13. However, the radical nitridation treatment is applicable also to other structures and shapes. For instance, the polycrystalline silicon layer 13a serving as a floating gate electrode 13 can be processed into a pillar shape, and a similar nitridation treatment can be performed thereon. Thus, its superficial portion can also be transformed into a silicon nitride film 16a serving as an interelectrode insulating film 16.

Second Embodiment

FIGS. 6A to 6C are schematic views showing a process for manufacturing FG type memory cells according to a second embodiment. Each figure is a perspective view showing a cross section of two adjacent memory cells in the memory cell array section of a NAND flash memory, for instance. The cross sections are cut along the channel length direction (bit line direction) and along the channel width direction (word line direction). The portions in common with those in the manufacturing method according to the first embodiment are labeled with like reference numerals. The process steps different from those in the first embodiment are described below.

FIG. 6A is a schematic view showing isolation trenches 9 provided in the surface of a silicon substrate 11 to form polycrystalline silicon plates 13b. A silicon oxide film 15 serving as an element insulation insulating film is formed inside the isolation trench 9.

Next, as shown in FIG. 6B, the exposed surface of the polycrystalline silicon plate 13b is subjected to radical nitridation treatment to form a silicon nitride film 16a. In this embodiment, this treatment is performed while the silicon substrate 11 is applied with a bias voltage having polarity such as to attract nitrogen radicals. For instance, if the stage with the silicon substrate 10 mounted thereon is applied with a negative bias voltage, positively charged nitrogen radicals in the plasma are attracted toward the silicon substrate, hence increasing the amount of nitrogen radicals supplied to the silicon substrate 11. Alternatively, it is also possible to apply an AC bias. In this case, positively charged nitrogen radicals and negatively charged nitrogen radicals are alternately attracted, and the supply amount of nitrogen radicals increases. The bias voltage applied to the stage is preferably in the range of 10-1000 V. Furthermore, this treatment can also be performed by applying a bias voltage to a holder with the silicon substrate placed thereon.

In performing the radical nitridation treatment, the silicon substrate 11 is heated to approximately 300-800° C. Nitrogen gas is turned into plasma under a reduced pressure of 2 kPa or less to generate nitrogen radicals, and the nitrogen radicals are supplied toward the silicon substrate 11. The treatment time is adjusted in the range of 10-1000 seconds based on the substrate temperature and the density of supplied nitrogen radicals so that a desired film thickness can be obtained. At this time, the silicon substrate 11 is applied with a bias voltage. Hence, charged nitrogen radicals are attracted thereto, and the nitridation rate increases. In particular, the top portion P of the polycrystalline silicon plate 13b is supplied with a larger amount of nitrogen radicals than the side surface. Hence, the nitridation rate is increased more significantly in the top portion P. For instance, when the superficial layer of the side surface of the polycrystalline silicon plate 13b is transformed into a silicon nitride film 16a having a thickness of approximately 8 nm, the superficial layer of the top portion P is transformed into a silicon nitride film 16b having a thickness of approximately 15 nm. Simultaneously, the superficial portion of the silicon oxide film 15 is transformed into a silicon oxynitride film 17a having a thickness of approximately 15 nm.

Also in this embodiment, the film thickness of the silicon nitride film 16a formed by radical nitridation is nearly equal to the thickness of silicon in the superficial portion to be nitridized. Hence, there is no narrowing of the width of the opening 9b between the adjacent polycrystalline silicon plates 13b, and the width of approximately 20 nm formed by etching is maintained. Furthermore, because the superficial portion of the polycrystalline silicon plate 13b is transformed into a silicon nitride film 16a by radical nitridation treatment, the width of the floating gate electrode 13 is narrowed. For instance, if the side surface of the polycrystalline silicon plate 13b processed into a width of approximately 30 nm is transformed from both sides into a silicon nitride film 16a having a thickness of approximately 8 nm, then the floating gate electrode 13 has a finish width of approximately 14 nm. Furthermore, in the silicon oxynitride film 17a formed at the surface of the silicon oxide film 15, the surface nitrogen concentration increases, with a maximum concentration of 20-90%.

Next, for instance, thermal oxidation treatment at 800-1100° C. is performed in an approximately 1-10% dilute oxygen gas atmosphere. Here, the treatment can also be performed under a reduced pressure. The treatment time can be adjusted in the range of 1-100 seconds based on the treatment temperature and the partial pressure of oxygen gas. Thus, the silicon nitride films 16a and 16b are densified, and added with 1 ppm to 1% oxygen, thereby repairing the film defects (such as so-called dangling bonds) generated by plasma damage during the radical nitridation treatment. Consequently, the insulating performance of the silicon nitride films 16a and 16b is significantly improved. Thus, the silicon nitride films 16a and 16b serve as insulating films capable of functioning well as an interelectrode insulating film 16. Furthermore, a similar repairing effect is achieved also in the silicon oxynitride film 17a, and can significantly improve the insulating performance. This suppresses charge migration between the adjacent floating gate electrodes 13, improving the charge retention characteristics of memory cells.

Moreover, oxygen gas transmitted through the silicon oxynitride film 17a reaches the surface of the bottom inner wall of the isolation trench 9 to form a silicon oxide film 18 as shown in FIG. 6C. For instance, the thickness of the silicon oxide film 18 can be approximately 5 nm near the interface with the tunnel insulating film 12. This thickness can be made thinner at a position farther from the interface. Thus, the channel width is narrowed by approximately 5 nm, with a finish width of approximately 25 nm. Hence, the cell coupling ratio can be increased, and the operating voltage can be reduced.

As described above, in this embodiment, radical nitridation treatment is performed while attracting nitrogen radicals to the silicon substrate 11. This enables anisotropic nitridation treatment. That is, the nitridation reaction rate is faster at the surface parallel to the silicon substrate, and slower at the surface perpendicular to the silicon substrate. Thus, while maintaining the spacing between the adjacent polycrystalline silicon plates 13b, a silicon nitride film 16a is formed at the side surface of the polycrystalline silicon plate 13b, and a thick silicon nitride film 16b is formed at the top portion of the polycrystalline silicon plate 13b. This can increase the memory integration density, and improve the insulating performance of the interelectrode insulating film formed at the top portion of the floating gate electrode 13. That is, this can suppress the increase of leakage current due to electric field concentration resulting from the convex shape of the top portion of the floating gate electrode 13, and the memory cell can achieve fast operation and high reliability. Furthermore, even in the case where the width of the floating gate electrode 13 after processing is 25 nm or less, for instance, the film thickness of the top portion can be formed thick without transforming the polycrystalline silicon plate 13b entirely into a silicon nitride film in the radical nitridation treatment.

In this embodiment, instead of thermal oxidation treatment, radical oxidation treatment may be performed while the silicon substrate 11 is applied with a bias voltage having polarity such as to attract oxygen radicals. Then, oxygen is sufficiently added to the thick silicon nitride film 16b formed at the superficial layer of the top portion P of the polycrystalline silicon plate 13b, thereby improving the insulating performance. Furthermore, in the thin silicon nitride film 16a formed at the superficial layer of the side surface, the amount of added oxygen is reduced, avoiding shrinkage of the opening width associated with the increase of film thickness.

Third Embodiment

FIGS. 7A to 9B are schematic views showing a process for manufacturing FG type memory cells according to a third embodiment. The portions in common with those in the first embodiment are labeled with like reference numerals, and the process steps different therefrom are described. Each figure shows a cross section of two adjacent memory cells in the memory cell array section of a NAND flash memory, for instance. The cross sections are cut along the channel length direction (bit line direction) indicated by arrow X in the figures, and along the channel width direction (word line direction) orthogonal to the channel length direction.

Figures 7A, 7B:
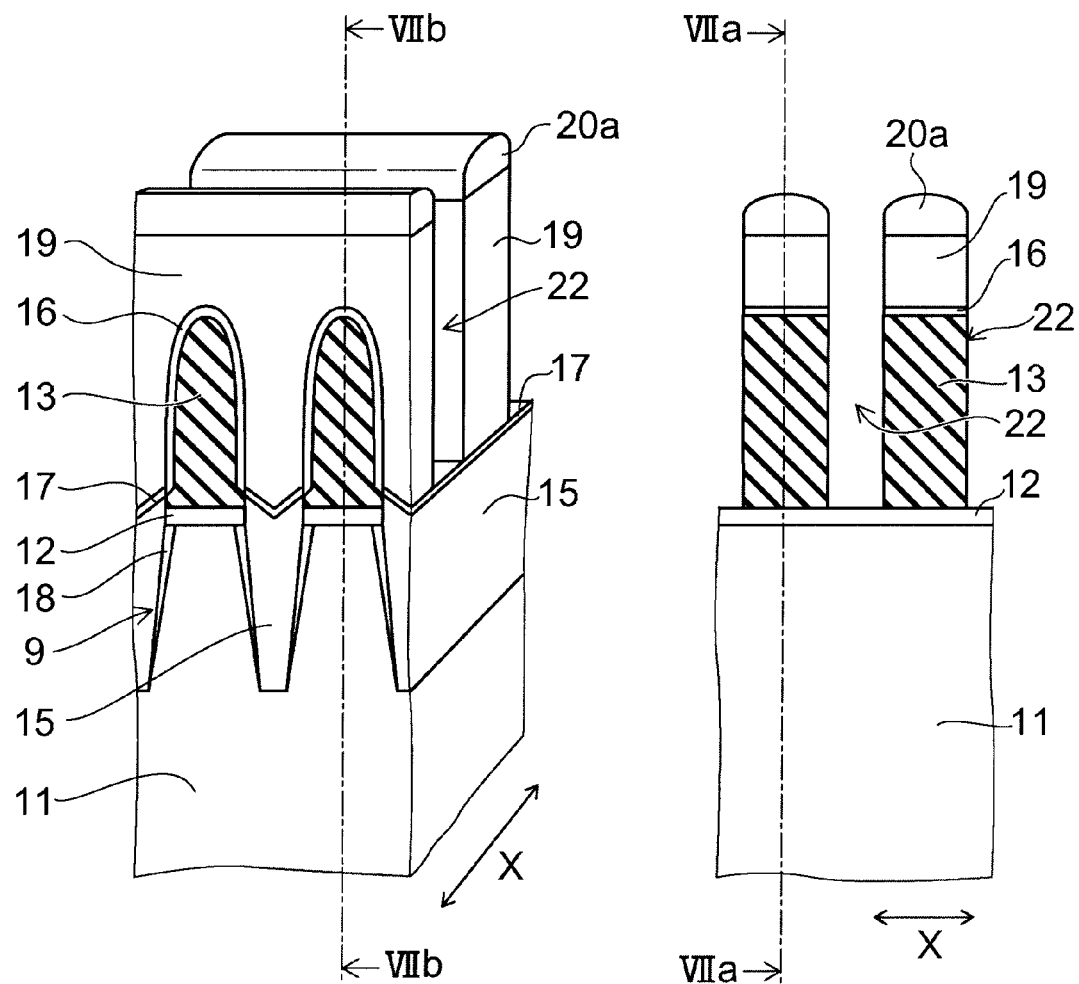

FIGS. 7A and 7B are schematic views showing that polycrystalline silicon plates 13b with a silicon nitride film 16a formed thereon are buried with a polycrystalline silicon layer 19a serving as a control gate electrode 19 (see FIGS. 3A and 3B), and then a slit portion 22 and a cell stack structure are formed by RIE, for instance. The slit portion 22 has an opening width of 25 nm and an opening depth of 150 nm. The cell stack structure has a width of 25 nm and a height of 150 nm. The front of the perspective view shown in FIG. 7A corresponds to the VIIa-VIIa cross section indicated in FIG. 7B. FIG. 7B shows the VIIb-VIIb cross section indicated in FIG. 7A.

As shown in FIGS. 7A and 7B, the polycrystalline silicon layer 19a (see FIGS. 3A and 3B) is etched using a processing mask 20a, and divided by a slit portion 22 formed in the channel width direction. The processing mask 20a is shaped like stripes extending in the direction orthogonal to the isolation trench 9. Hence, the side surface of the stack structure divided by the slit portion 22 is a surface orthogonal to the isolation trench 9. The polycrystalline silicon layer 19a divided by the slit portion 22 constitutes a control gate electrode 19, and the polycrystalline silicon plate 13b constitutes a floating gate electrode 13.

Next, the silicon substrate 11 processed into the state shown in FIGS. 7A and 7B is subjected to thermal oxynitridation treatment in a nitrogen monoxide atmosphere. The temperature range is 700-1100° C., and the pressure range is 1-100 kPa, for instance. The treatment time is adjusted in the range of 1-100 minutes based on the temperature and the partial pressure of nitrogen monoxide gas. Thus, on the side surface of the cell stack structure, a silicon oxynitride film is formed at the exposed side surface of the floating gate electrode 13 and the control gate electrode 19.

Figures 8A, 8B:
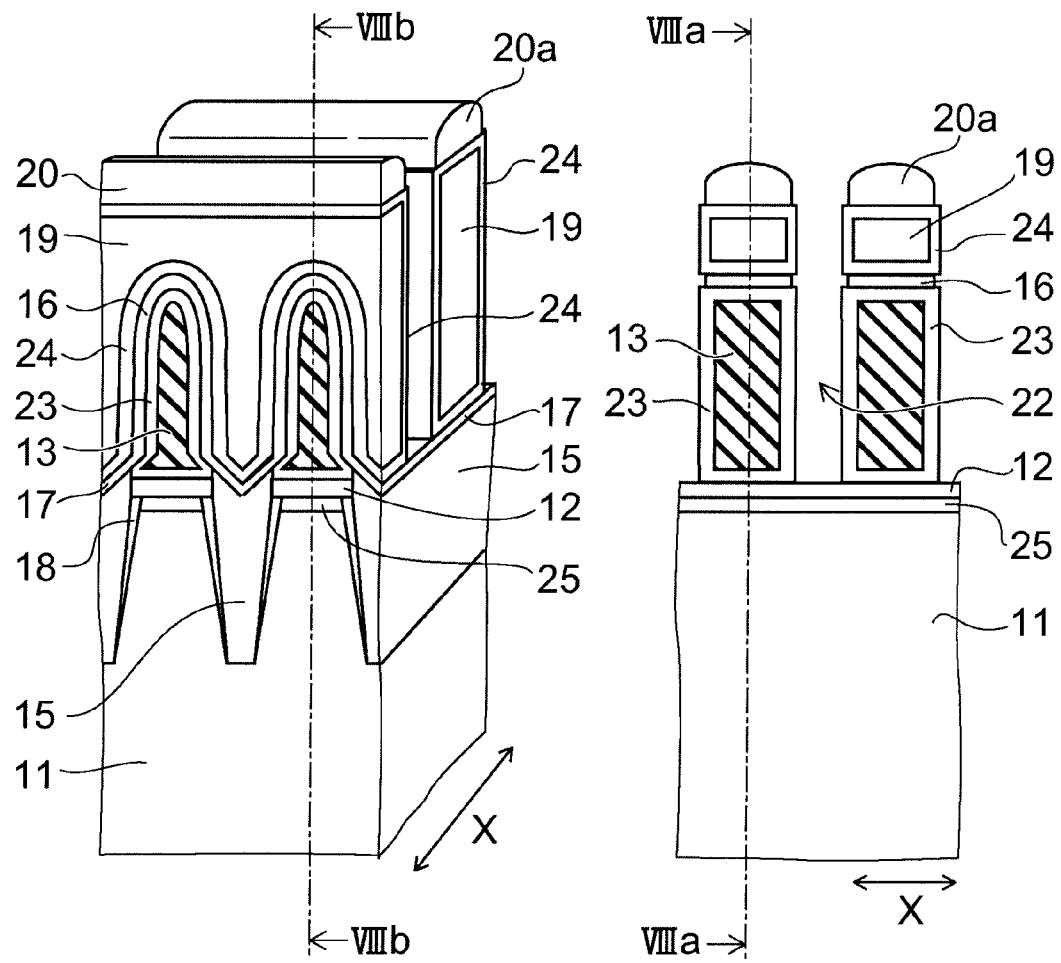

FIGS. 8A and 8B are schematic views showing the silicon oxynitride film formed by thermal oxynitridation treatment. The front of the perspective view shown in FIG. 8A corresponds to the VIIIa-VIIIa cross section indicated in FIG. 8B. FIG. 8B shows the VIIIb-VIIIb cross section indicated in FIG. 8A.

As shown in FIG. 8B, the silicon oxynitride film 23 is formed not only at the surface of the floating gate electrode 13 exposed at the side surface of the cell stack structure, but also inside the floating gate electrode 13. More specifically, nitrogen monoxide gas has the property of diffusing in polycrystalline silicon. Hence, nitrogen monoxide gas diffuses from the side surface of the cell stack structure into the floating gate electrode 13, and forms a silicon oxynitride film 23 also at the interface between the interelectrode insulating film 16 and the floating gate electrode 13, and the interface between the floating gate electrode 13 and the tunnel insulating film 12. Similarly, also in the control gate electrode 19, a silicon oxynitride film 24 is formed not only at the surface exposed at the side surface of the cell stack structure, but also at the interface between the processing mask 20a and the control gate electrode 19, and the interface between the interelectrode insulating film 16 and the control gate electrode 19.

Furthermore, nitrogen monoxide gas diffuses also in the silicon oxide film. Hence, nitrogen monoxide gas is transmitted through the tunnel insulating film 12 to the surface of the silicon substrate 11. Thus, a silicon oxynitride film 25 is formed at the interface between the tunnel insulating film 12 and the silicon substrate 11. The thickness of the silicon oxynitride film 23, 24, 25 varies with the oxynitridation temperature and the amount of oxynitridizing components, and can be adjusted to 2-5 nm, for instance. Thus, an interelectrode insulating film made of the stacked structure of silicon oxynitride film 23/silicon nitride film 16/silicon oxynitride film 24 can be formed. Furthermore, between the floating gate electrode 13 and the silicon substrate 11, a tunnel insulating film made of the stacked structure of silicon oxynitride film 23/silicon oxide film 12/silicon oxynitride film 25 is formed. Here, the film thickness of the silicon oxynitride film 23, 24, 25 can be described in detail as follows. In the cross section in the channel length direction shown in FIG. 8B, the silicon oxynitride film is formed relatively thin in the center portion of the cell stack structure, and formed relatively thick near the side surface of the cell stack structure. For instance, the film thickness near the side surface of the cell stack structure can be approximately twice that in the center portion of the cell stack structure.

Figures 9A, 9B:
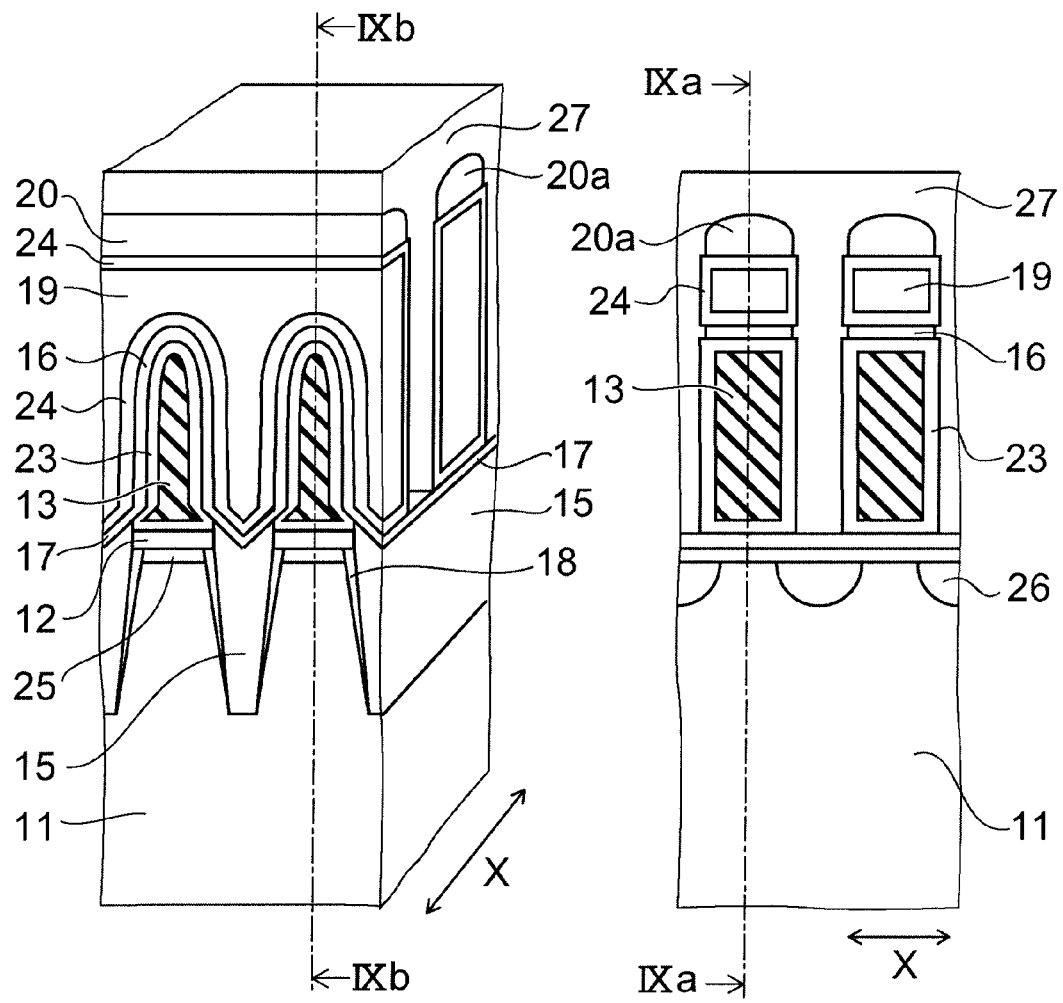

FIGS. 9A and 9B are schematic views showing the slit portion 22 filled with an interlayer insulating film 27 made of silicon oxide film. The front of the perspective view shown in FIG. 9A corresponds to the IXa-IXa cross section indicated in FIG. 9B. FIG. 9B shows the IXb-IXb cross section indicated in FIG. 9A.

Subsequent to the thermal oxynitridation treatment, the cell stack structure is used as a mask to introduce an impurity element such as arsenic into the silicon substrate 11 by ion implantation. Furthermore, the implanted impurity is activated by heat treatment to form a diffusion layer 26 as shown in FIG. 9B. Subsequently, for instance, the slit portion 22 is filled with an interlayer insulating film 27 made of silicon oxide film by CVD. Thus, the structure shown in FIGS. 9A and 9B is completed.

As described above, according to this embodiment, an interelectrode insulating film made of the stacked structure of silicon oxynitride film 23/silicon nitride film 16/silicon oxynitride film 24 is formed. Thus, the interelectrode insulating film can be easily thickened. Furthermore, a silicon oxynitride film with good film quality is formed above and below the silicon nitride film 16 by thermal oxynitridation. Thus, the insulating performance of the interelectrode insulating film is dramatically improved, and the memory cell can achieve very fast operation and very high reliability. In particular, the effect of improving the insulating performance is more significant because the silicon oxynitride film can be formed thick at the side surface of the cell stack structure subjected to high electric field during operation.

Furthermore, the silicon oxynitride film 23, 24, 25 is thicker than the silicon layer to be oxynitridized. Hence, the interelectrode insulating film expands in thickness. Thus, between the adjacent floating gate electrodes 13, the control gate electrode 19 is pressed in the channel width direction. This eliminates the joining portion (so-called seam) of the polycrystalline silicon layer 19a buried between the floating gate electrodes 13, also achieving the effect of decreasing the resistance of the control gate electrode 19.

In the above example of this embodiment, nitrogen monoxide gas is used as an oxynitridizing agent. However, it is also possible to use other oxynitridizing agents such as nitrous oxide gas. In the case of using nitrogen monoxide gas, the detailed structure of the interelectrode insulating film is such a stacked structure as silicon nitride film/silicon oxide film/silicon nitride film (oxygen-added silicon nitride film)/silicon oxide film/silicon nitride film. Thus, formation of the overlying and underlying silicon nitride film can prevent the so-called bird's beak oxidation occurring in forming the interlayer insulating film 27. Consequently, the effect of reducing the characteristics variation of memory cells can be achieved.

Furthermore, in the above example of this embodiment, the control gate electrode 19 is made of polycrystalline silicon. However, the control gate electrode 19 may have a multilayer structure as long as the lowermost layer is made of a material primarily composed of silicon. In this case, the resistance of the control gate electrode can be reduced by using a material such as metal silicide or metal for the second and higher layers. This enables fast memory operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:
1. A method for manufacturing a semiconductor device, comprising:
forming a first conductor layer containing silicon on a surface of a semiconductor layer via a tunnel insulating film;

forming an isolation trench extending from a surface of the first conductor layer to the semiconductor layer to form a plurality of conductive plates serving as floating gate electrodes on the tunnel insulating film, the conductive plates being formed from the first conductor layer and spaced from each other by a prescribed width;

filling the isolation trench with an element insulation insulating film from bottom of the isolation trench to an intermediate portion of a side surface of each of the conductive plates;

forming a silicon nitride film on an exposed surface of the each of the conductive plates not covered with the element insulation insulating film while maintaining a spacing between the plurality of spaced conductive plates with the silicon nitride film at a width comparable to or larger than the prescribed width, the silicon nitride film being formed by nitridizing the silicon contained in the spaced conductive plates by a nitrogen radical generated by exciting a raw material gas containing a nitrogen element; and forming a second conductive layer serving as a control gate electrode above the spaced conductive plates with the silicon nitride film and the element insulation insulating film buried in the isolation trench, the second conductive layer filling the spacing maintained at the width comparable to or larger than the prescribed width between the spaced conductive plates, further comprising:

forming the floating gate electrode and the control gate electrode by selectively etching a structure of the plurality of conductive plates buried with the second conductor layer serving as the control gate electrode to expose a side surface perpendicular to the isolation trench; and performing oxynitridation treatment on the side surface to simultaneously form a silicon oxynitride film:

on each of the side surfaces;

at an interface between the silicon nitride film and the floating gate electrode; and at an interface between the silicon nitride film and the control gate electrode.

2. The method according to claim 1, further comprising:

adding oxygen to the silicon nitride film by exposing the silicon nitride film to a gas atmosphere containing an oxygen element after forming the silicon nitride film.

3. The method according to claim 1, wherein the raw material gas further contains an oxygen element, and the silicon nitride film added with oxygen is formed on the surface of the each of the conductive plates by a nitrogen radical and oxygen radical generated by exciting the raw material gas.

4. The method according to claim 1, wherein the silicon nitride film is formed by applying to the semiconductor ayer a bias voltage having polarity such as to attract the nitrogen radical.

5. The method according to claim 1, wherein the oxynitridation treatment of the side surface is thermal oxynitridation treatment performed in an atmosphere containing nitrogen monoxide gas.

6. The method according to claim 1, wherein a silicon substrate with the conductive plates provided is heated to a temperature of 300° C. to 800° C. to nitridize the silicon contained in the conductive plates by the nitrogen radical.

7. The method according to claim 1, wherein a liner insulating film is formed on an inner surface of the isolation trench.

* * * * *

UNITED STATES PATENT AND TRADEMARK OFFICE
CERTIFICATE OF CORRECTION

| | | |
|---|---|---|
| PATENT NO. | : 8,497,184 B2 | Page 1 of 1 |
| APPLICATION NO. | : 12/850730 | |
| DATED | : July 30, 2013 | |
| INVENTOR(S) | : Ozawa | |

It is certified that error appears in the above-identified patent and that said Letters Patent is hereby corrected as shown below:

In the Claims

Claim 4, column 18, line 19, change "ayer" to --layer--.

Signed and Sealed this
First Day of October, 2013

Teresa Stanek Rea
*Deputy Director of the United States Patent and Trademark Office*